(12) United States Patent
Tokura et al.

(10) Patent No.: US 7,468,141 B2
(45) Date of Patent: Dec. 23, 2008

(54) METHOD FOR DECORATING DIE SURFACE AS WELL AS DIE

(75) Inventors: Kunihiko Tokura, Tokyo (JP); Masaru Uryu, Chiba (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/521,141

(22) PCT Filed: May 21, 2004

(86) PCT No.: PCT/JP2004/007320

§ 371 (c)(1),
(2), (4) Date: May 18, 2005

(87) PCT Pub. No.: WO2004/103671

PCT Pub. Date: Dec. 2, 2004

(65) Prior Publication Data

US 2005/0244535 A1   Nov. 3, 2005

(30) Foreign Application Priority Data

May 23, 2003  (JP) ............................. 2003-146741

(51) Int. Cl.
*B29C 33/38* (2006.01)
(52) U.S. Cl. .......................................... 216/28; 216/52
(58) Field of Classification Search ....................... None
See application file for complete search history.

(56) References Cited

U.S. PATENT DOCUMENTS

| | | | | |
|---|---|---|---|---|
| 2,284,929 A | * | 6/1942 | Stewart | 164/45 |
| 2,816,025 A | * | 12/1957 | Dahlberg | 430/323 |
| 3,462,524 A | * | 8/1969 | Lemelson | 264/255 |
| 3,504,063 A | * | 3/1970 | Lemelson | 264/430 |
| 4,102,735 A | * | 7/1978 | Weglin | 216/11 |
| 4,254,184 A | * | 3/1981 | Tsukagoshi et al. | 428/408 |
| 4,388,388 A | * | 6/1983 | Kornbau et al. | 430/258 |
| 4,437,924 A | * | 3/1984 | Weglin | 216/41 |
| 4,447,286 A | * | 5/1984 | Weglin | 156/515 |
| 4,497,686 A | * | 2/1985 | Weglin | 216/41 |
| 4,579,634 A | * | 4/1986 | Weglin | 205/50 |
| 4,985,116 A | * | 1/1991 | Mettler et al. | 438/674 |
| 5,344,729 A | * | 9/1994 | Akins et al. | 430/5 |
| 5,445,772 A | * | 8/1995 | Uchida et al. | 264/35 |
| 5,552,249 A | * | 9/1996 | Jensen et al. | 430/5 |
| 5,650,249 A | * | 7/1997 | Dull et al. | 430/5 |
| 6,013,331 A | * | 1/2000 | Ogawa | 427/515 |
| 6,156,484 A | * | 12/2000 | Bassous et al. | 430/313 |

(Continued)

FOREIGN PATENT DOCUMENTS

EP   0 320 925   6/1989

(Continued)

*Primary Examiner*—Allan Olsen
(74) *Attorney, Agent, or Firm*—Lerner, David, Littenberg, Krumholz & Mentlik, LLP

(57) ABSTRACT

In order to transcribe a pattern without seams of a photomask onto the whole or part of a die having a three-dimensional shape, a general-purpose polyester film coated with a photosensitive material is used as a photomask and, after forming a pattern, the photomask is struck through vacuum molding or the like to a die molded into the same shape as that of a die to be exposed and developed.

7 Claims, 2 Drawing Sheets

U.S. PATENT DOCUMENTS

| | | | |
|---|---|---|---|
| 6,416,908 B1 * | 7/2002 | Klosner et al. | 430/5 |
| 6,627,092 B2 * | 9/2003 | Clements et al. | 216/13 |
| 6,916,181 B2 * | 7/2005 | Brown et al. | 439/66 |
| 2001/0048174 A1 * | 12/2001 | Yamada et al. | 264/131 |
| 2004/0265543 A1 * | 12/2004 | Komatsu et al. | 428/151 |
| 2005/0244535 A1 * | 11/2005 | Tokura et al. | 425/403 |

FOREIGN PATENT DOCUMENTS

| | | | |
|---|---|---|---|
| JP | 51-063866 | | 6/1976 |
| JP | 57178810 A | * | 11/1982 |
| JP | 60-024016 | | 2/1985 |
| JP | 07319146 A | * | 12/1995 |
| JP | 10097054 A | * | 4/1998 |
| JP | 2000127252 A | * | 5/2000 |
| JP | 2001347534 A | * | 12/2001 |

* cited by examiner

METHOD FOR DECORATING DIE SURFACE AS WELL AS DIE

TECHNICAL FIELD

The present invention relates to a die used for resin molding such as injection molding, and a method for decorating the surface of the die.

BACKGROUND ART

Of late, the external appearance and finish of plastic molding used in automobiles and home electric appliances have come to be highly valued in order to enhance luxury as well as to increase an added-value of commercial merchandise. Particularly, resin molding that is molded by injection molding or the like can have a variety of facades depending on die surface decorations. Conventionally, of the die surface decorations in molding, there has been known an etching method by which to corrode the die through the functions of chemical agents, making it possible to form on the die surface a variety of patterns such as satin finished surface, leathery surface, grain woody texture, linear embossing, geometric patterns or the like. In addition, there is known a sand-blast (honing) processing that forms a fine pattern on the surface of an object by physically blasting and glass beads.

On the other hand, there is known a method of exposing a metal part of the portion necessary for etching or similar by spraying a photoresist in liquid form across the whole of a die and sticking a photoengraved film-like photomask to the die to be exposed and developed.

Hereinafter, a method using a conventional film-like photomask will be explained with reference to FIGS. 3.

First, as shown in FIG. 3A, photomasks 11, 12, and 13 are made by cutting off a photoengraved film-like photomask according to a plan view spread out based on the shape of a die. Then, as shown in FIG. 3B, the cut-off photomasks 11, 12, and 13 are stuck to a die 20 coated with a photoresist, and seams of the photomasks are joined together by tapes or the like to be exposed and developed. Next, the developed condition of the photoresist is examined, and after discontinuity in the joined parts of the photomasks is corrected, etching is performed to form a pattern on the die 20.

Meanwhile, there is known another method of directly exposing a photoresist coated on a die by using laser beams.

In Japanese published patent application No. 51-63866 published by the Japanese Patent Office, a method is disclosed in which concavity and convexity are formed by an etching process on the core side surface of a die used for injection molding.

However, the decorations by the etching method and sand-blast process (honing) have been rarely applied to the whole of the die, so that it is necessary to cover and hide the parts to which it is unnecessary to apply thereof by adhesive tapes for masking or the like. There are many cases where it depends on manual work such as when the die has a complicated three-dimensional configuration and when it has parts in need of fine work such that it caused a lot of trouble and there was a limit in its process.

On the other hand, the masking method that uses photoresist has a high feasibility of molding a pattern with high accuracy when it is compared with the above-mentioned masking method. However, when it comes to the case where a pattern needs to be incised on the surface of a die, the photomask must be cut apart and then joined with each other on a three-dimensional die, which leads to an occurrence somewhere of a seam between the photoresist, making perfect transcription impossible. As a result, as shown in FIG. 3C, there remains a seam 20a in the pattern on the surface of the die, which is a problem in terms of exterior appearance. Further, there is no other way to join the photoresist than to be dependent on manual work, which requires a lot of trouble.

DISCLOSURE OF THE INVENTION

A second invention is a method for decorating the surface of a die according to the first invention, wherein molding the film-like photomask into the same shape as that of aforesaid die is performed by sticking a heated photomask to a predetermined die.

A third invention is a die for resin molding wherein a film-like photomask molded into the same shape as that of aforesaid die is stuck to a photoresist coated on the surface of aforesaid die to be exposed and developed for etching, and a pattern made on aforesaid photomask is formed on the surface thereof.

A first invention is a method for decorating the surface of a die which comprises the steps of coating the surface of the die with a photoresist; molding a film-like photomask into the same shape as that of aforesaid die; sticking the photomask molded into aforesaid shape to aforesaid die coated with the photoresist to be exposed and developed; and etching a pattern formed on aforesaid photomask into aforesaid developed die.

By employing such a manner, a pattern can be uniformly formed without difficulties on the surface of a die having a three-dimensional curved surface and molded components with an excellent appearance can be obtained. Accordingly, a wide range of three-dimensional designs as has been conventionally impossible can be obtained, enabling value-added products to be provided.

BEST MODE FOR CARRYING OUT THE INVENTION

Hereinafter, an embodiment of the present invention will be explained with reference to FIGS. 1 and 2A to 2H.

Figure 1:
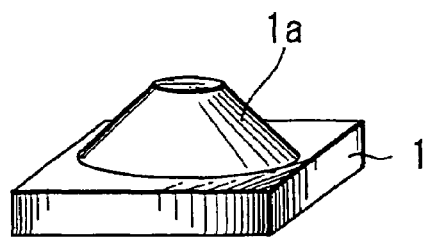
FIG. 1 is a perspective view showing an example of the shape of a die.

FIG. 1 is a perspective view showing an example of the shape of a die to which this embodiment is applied. A die 1 is one for molding a diaphragm used in a speaker. The die 1 has a cone-shaped three-dimensionally curved surface part 1a, and in this embodiment, on account of design and the like, a pattern such as a geometric pattern and the like will be formed on the overall surface of the diaphragm including the cone-shaped three-dimensional curved surface part 1a.

FIGS. 2A to 2H show an example of an operational process for decorating the surface of a die according to the embodiment of the present invention.

Figure 2A:
FIGS. 2A through 2H are explanatory diagrams showing a process for decorating the surface of a die according to an embodiment of the present invention.

First, a photomask 2 shown in FIG. 2A is made. In this embodiment, the design to be formed is a grid-like pattern. This pattern is drawn by a CAD (Computer Aided Design) and photoengraved on a polyester film of 100 μm in thickness. This is the photomask 2 in which forming of a pattern is finished.

Figure 2B:
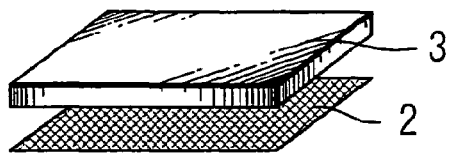

Next, as shown in FIG. 2B, the photomask 2 is heated using a far-infrared ray heater 3 in order to be molded into the same shape as that of a die. Temperature and heating time in this case are respectively selected in the range of 170° C. to 180° C. of not destroying the molded pattern and 20 sec to 30 sec. Since the temperature and time depend on the thickness of the film that is used as the photomask 2, conditions are not restricted to the above described ones.

Figure 2C:
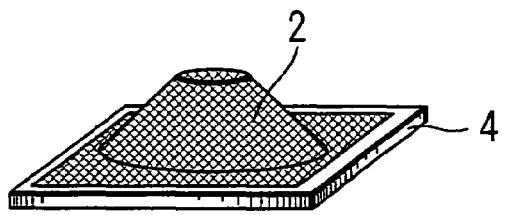

Next, as shown in FIG. 2C, in order to mold the heated photomask 2 into the same shape as that of the die 1, the heated photomask is stuck to a molding die 4 by means of a vacuum molding method and is molded.

Figure 2D:
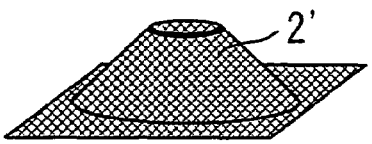

With the above described method, as shown in FIG. 2D, a photomask 2' having the same shape as that of the die is made.

Figure 2E:
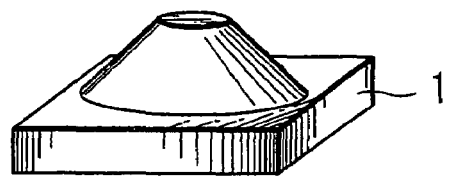
Figure 2F:
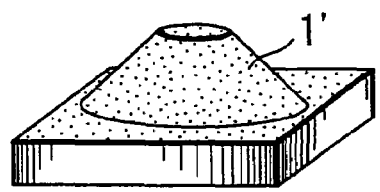

Next, of the die 1 shown in FIG. 2E, parts that are irrelevant to the process such as a part into which a mold base is inserted and the like are processed with masking tapes and the like, and then the die 1 is subjected to a degreasing processing, dried, and spray-coated with a photoresist in liquid form; and is dried at 80° C. in temperature for 15 minutes. It is shown in FIG. 2F.

Figure 2G:
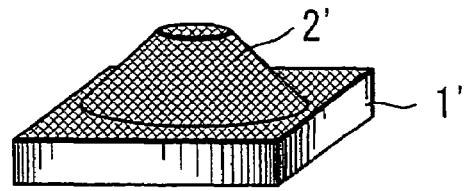

Next, as shown in FIG. 2G, the photomask 2' molded into the same shape as that of the die is stuck to a dried die 1' coated with a photoresist, which is exposed to predetermined energy and spray-developed with 1% sodium carbonate aqueous solution of 20° C. in temperature, for example. As a result, a seamless pattern can be transcribed onto the die 1'. In addition, since a process of correcting seams between the joined photoresists is not required, procedures can be simplified.

Figure 2H:
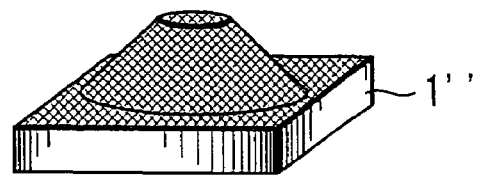

The above pattern-transcribed die 1' is sprayed with iron chloride aqueous solution, and after rinsed in water, the photoresist is exfoliated by, for example, 2% sodium hydroxide aqueous solution of 50° C. in temperature to provide an etching-finished die 1" with a predetermined pattern formed thereon, as shown in FIG. 2H.

Figure 3A:
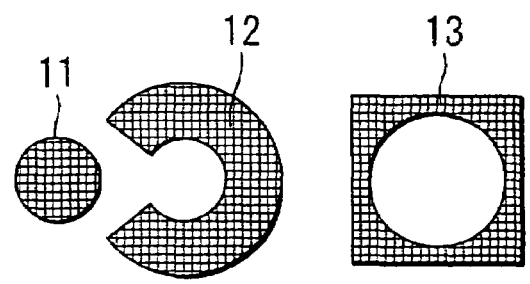
FIGS. 3A to 3C are explanatory diagrams showing a process of decorating the surface of a die according to prior art.
Figure 3B:
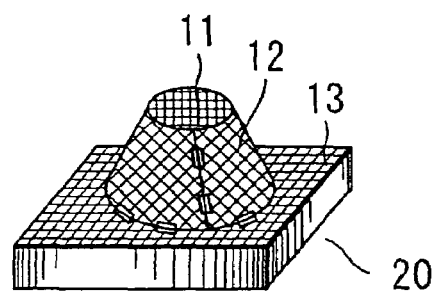
Figure 3C:
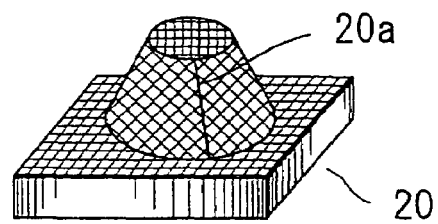

When a diaphragm is injection-molded using the die 1" formed by the process as described above, the molded diaphragm has a uniform pattern formed on the whole surface including the cone shape thereof to have an excellent external appearance. That is, a seam 20a shown in FIG. 3C as a conventional example does not remain on the surface, with the result that a pattern drawn in the photomask 2 is formed on a molded component exactly as it is.

It should be noted that a film used as the photomask according to this embodiment is formed of a general-purpose polyester film coated with a photo-sensitive material and the thickness thereof is preferably 100 μm or more and 250 μm or less, and the film is required to be capable of being molded by such molding technology as vacuum molding or the like. Needless to say, other materials and thickness than those of the above described film can be used as long as they have the feasibility of vacuum molding. A photosensitive material coated thereon is not particularly specified; however the material preferably possesses thermal resistance, so that when a pattern-formed film is vacuum-molded, the material extends accordingly to the amount of stretch of a base polyester without destroying the formed pattern due to heat at the time of molding.

Further, photoresist used in this embodiment may be either of a negative type or a positive type as long as the photoresist has the feasibility of being spray-coated because it needs to be coated on a three-dimensionally curved surface, and becomes tack-free when dried.

A light source that is used at a time of the exposure of the photoresist is preferably a device that can more or less change an angle of light thereof, because the amount of exposure of the vertical surface of a die with respect to the direction of the light source is not sufficient; and the light source is not specifically limited as long as it is corresponding to an absorption wavelength of the photoresist.

In addition, although the present invention is applied to the die for molding the diaphragm used in a speaker, needless to say the above described embodiment can be applied to a die for molding other resin components. Further, as for a pattern to be formed on the surface of a die, a letter or symbol, not a uniform pattern mentioned above, may be formed on the surface thereof as a pattern.

INDUSTRIAL APPLICABILITY

According to the present invention, a pattern can be uniformly formed without difficulties on the surface of a die having a three-dimensional curved surface and molded components with an excellent appearance can be obtained. Accordingly, a wide range of three-dimensional designs as has been conventionally impossible can be obtained, enabling value-added products to be provided.

The invention claimed is:

1. A method for forming a diaphragm of a speaker, said method comprising:

forming a die by spray coating the surface of the die with a photoresist, vacuum molding a seamless one piece photomask having a pattern thereon into a same shape as a shape of said die which corresponds to a shape of the diaphragm of the speaker, sticking the molded seamless one piece photomask to said die coated with the photoresist, and causing the pattern of the molded seamless one piece photomask to be transcribed onto said die; and forming the diaphragm of the speaker by an injection molding process by use of the formed die, in which the formed diaphragm has a seamless pattern formed thereon which corresponds to the pattern of the photomask.

2. A method for decorating a surface of a die usable a plurality of times so as to form a plurality of diaphragms for a plurality of speakers by a molding process, said method comprising:

spray coating the surface of the die with a photoresist;

vacuum molding a seamless one piece photomask having a pattern thereon into a same shape as a shape of said die which corresponds to a shape of the diaphragm of the speaker;

sticking the molded seamless one piece photomask to said die coated with the photoresist; and causing the pattern of the molded seamless one piece photomask to be transcribed onto said die, in which the die is usable to form the diaphragms of the plurality of speakers such that each of the diaphragms has a seamless pattern formed thereon which corresponds to the pattern of the photomask.

3. A method for decorating a surface of a die usable a plurality of times so as to form a plurality of three-dimensional objects by a molding process, said method comprising the steps of:

spray coating the surface of the die with a photoresist;

vacuum molding a photomask into a same shape as a shape of said die which corresponds to a shape of the three-dimensional object;

sticking the photomask molded into said shape to said die coated with the photoresist; and causing a pattern formed on said photomask to be formed onto said die, in which the die having the pattern formed thereon is usable to form the plurality of three-dimensional objects each having the pattern formed thereon, and wherein said pattern is formed on a surface of the photomask uniformly.

4. The method for decorating the surface of a die according to claim 3, in which the molding step includes heating the photomask and sticking a heated photomask to a predetermined die.

5. The method for decorating the surface of a die according to claim 3, in which the three-dimensional object is a diaphragm of a speaker.

6. The method for decorating the surface of a die according to claim 3, wherein said pattern is a geometric pattern.

7. The method for decorating the surface of a die according to claim 3, wherein said pattern is a grid-like pattern.

\* \* \* \* \*